United States Patent
Pon et al.

(10) Patent No.: US 11,652,031 B2
(45) Date of Patent: May 16, 2023

(54) SHRINKABLE PACKAGE ASSEMBLY

(71) Applicant: Intel Corporation, Santa Clara, CA (US)

(72) Inventors: Florence Pon, Folsom, CA (US); Yi Xu, Folsom, CA (US); Min-Tih Lai, Bothell, WA (US)

(73) Assignee: Intel Corporation, Santa Clara, CA (US)

( * ) Notice: Subject to any disclaimer, the term of this patent is extended or adjusted under 35 U.S.C. 154(b) by 1007 days.

(21) Appl. No.: 16/219,168

(22) Filed: Dec. 13, 2018

(65) Prior Publication Data

US 2020/0194344 A1 Jun. 18, 2020

(51) Int. Cl.
*H01L 23/495* (2006.01)
*H01L 23/373* (2006.01)
*H01L 23/498* (2006.01)
*H01L 23/00* (2006.01)

(52) U.S. Cl.
CPC ........ *H01L 23/4952* (2013.01); *H01L 23/373* (2013.01); *H01L 23/4985* (2013.01); *H01L 23/49524* (2013.01); *H01L 24/06* (2013.01); *H01L 24/83* (2013.01); *H01L 24/85* (2013.01); H01L 2224/04042 (2013.01)

(58) Field of Classification Search
CPC ........ H01L 24/06; H01L 24/85; H01L 24/48; H01L 24/49; H01L 23/4952; H01L 23/373; H01L 23/49524; H01L 24/45; H01L 24/46; H01L 23/4985; H01L 24/83
See application file for complete search history.

(56) References Cited

U.S. PATENT DOCUMENTS

| | | | | |
|---|---|---|---|---|
| 5,148,265 A * | 9/1992 | Khandros | ............. | H01L 21/822 257/668 |
| 5,180,311 A * | 1/1993 | Schreiber | ............. | H01R 12/613 439/74 |
| 5,261,158 A * | 11/1993 | Schreiber | ............. | H05K 3/4007 29/846 |
| 6,211,572 B1 * | 4/2001 | Fjelstad | ............. | H01L 23/3114 257/781 |
| 6,936,928 B2 * | 8/2005 | Hedler | ............. | H01L 24/81 257/737 |
| 2002/0155728 A1 * | 10/2002 | Khandros | ............. | H01L 22/32 257/E23.07 |
| 2004/0201074 A1 * | 10/2004 | Khandros | ............. | H01L 24/13 257/E23.021 |
| 2004/0238819 A1 * | 12/2004 | Maghribi | ............. | C08J 5/18 257/734 |
| 2005/0285246 A1 * | 12/2005 | Haba | ............. | H01L 23/4985 257/E23.105 |
| 2008/0113504 A1 * | 5/2008 | Lee | ............. | H01L 24/15 257/E21.477 |
| 2010/0148325 A1 * | 6/2010 | Gruenhagen | ............. | H01L 24/33 257/E21.585 |
| 2011/0180934 A1 * | 7/2011 | Takeda | ............. | H01L 24/32 257/782 |
| 2016/0254251 A1 * | 9/2016 | Bae | ............. | H01L 23/49811 257/698 |

* cited by examiner

*Primary Examiner* — Alonzo Chambliss
(74) *Attorney, Agent, or Firm* — Schwabe, Williamson & Wyatt, P.C.

(57) ABSTRACT

A semiconductor structure is disclosed. The semiconductor structure includes a substrate an elastomer coupled to the substrate and a plurality of bondfingers on the elastomer. The substrate, the elastomer and the bondfingers are configured to cooperatively expand and retract.

17 Claims, 6 Drawing Sheets

SHRINKABLE PACKAGE ASSEMBLY

TECHNICAL FIELD

Embodiments of the disclosure pertain to semiconductor packages and, in particular, to a shrinkable semiconductor package assembly.

BACKGROUND

In the design of wire bond based microelectronic packages, the manner in which the package fits around the silicon is determined by the design rules for die edge to bondfinger edge, bondfinger lengths, and bondfinger to package edge distances. Previous approaches to addressing the constraints include reducing bondfinger length by eliminating the number of wirebonds, using smaller capillary outer diameters, using smaller diameter wires, and taking more assembly risks by reducing the die edge to bondfinger or the bondfinger to package edge distances. Many times it is not possible to fit all of the silicon associated with a design into a package of a particular size.

In a previous approach the space that the bondfingers occupy can be reduced by designing shorter and/or staggered and fanned out bondfingers. However, if the length of the bondfingers is reduced, or if fanned out or staggered, bondfingers must be accommodated by additional package size, and/or the number of die that can be stacked can be limited.

DESCRIPTION OF THE EMBODIMENTS

Figure 1A:
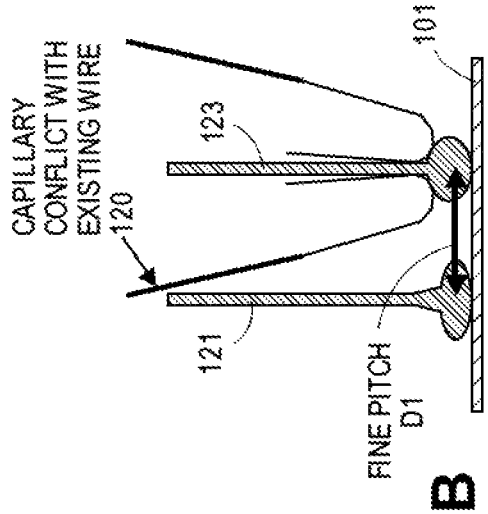
FIG. 1A shows a chip on a package substrate that is coupled to bondfingers by wire bonds according to an embodiment.

A shrinkable semiconductor package structure is described. It should be appreciated that although embodiments are described herein with reference to example shrinkable semiconductor package structure implementations, the disclosure is more generally applicable to shrinkable semiconductor package structure implementations as well as other type shrinkable semiconductor package structure implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Previous approaches to addressing the design rule constraints related to bondfingers include reducing bondfinger length by eliminating the number of wirebonds, using smaller capillary outer diameters, using smaller diameter wires, and taking more assembly risks by reducing the die edge to bondfinger or the bondfinger to package edge distances. However, if the length of the bondfingers is reduced, or if fanned out or staggered bondfingers must be accommodated by additional package size, the number of die that can be stacked can be limited.

A process that overcomes the shortcomings of such approaches is disclosed herein. As part of a disclosed approach, the bondfinger area of the substrate can be stretched prior to wirebonding. The stretching of the substrate provides increased space for landing wires. Subsequently, the substrate can be retracted to a compact form for subsequent process operations and for inclusion in the finished product. Existing solutions cannot be applied in all cases and represent mere evolutionary changes. Smaller diameter capillaries with smaller diameter wires result in higher impedance connections that slow down I/O signal speed and cause poor power delivery if die-to-die bond connections are used. In an embodiment, the use of a wire diameter that is suitable for meeting the electrical requirements is enabled.

FIG. 1A shows a die formed on a package substrate and coupled to bondfingers by wires according to an embodiment. In particular, FIG. 1A shows substrate 101, die 103, bondfinger region 105, bondfingers 107 and wirebonds 109.

Referring to FIG. 1A, the die 103 is formed above the substrate 101. The bondfingers 107 are formed on the surface of the substrate 101. The wirebonds 109 connect the die 103 to the bondfingers 107. In an embodiment, the bondfingers 107 are located in a portion of the substrate that is adjacent to the periphery of the substrate 101. In an embodiment, the substrate 101 can be stretched to increase the area for the landing wires and then retracted for inclusion in the finished product. In an embodiment, the bondfingers 107 are formed above an elastomer that enables the bondfingers to be stretched along with the substrate 101 prior to the coupling of the wirebonds 109 to the bondfingers 107. In an embodiment, the substrate 101 and the bondfingers 107 can thereafter be shrank to a desired length (e.g., its pre-stretch length) such that the space needed to accommodate the bondfingers 107 is reduced without requiring a reduction in the number of bondfingers that are used in the design. Accordingly, the number of die 103 that can be stacked does not have to be limited due to decreased bondfingers. Moreover, the package size does not need to be increased to accommodate a fan out of staggered bondfingers 107.

Figure 1B:
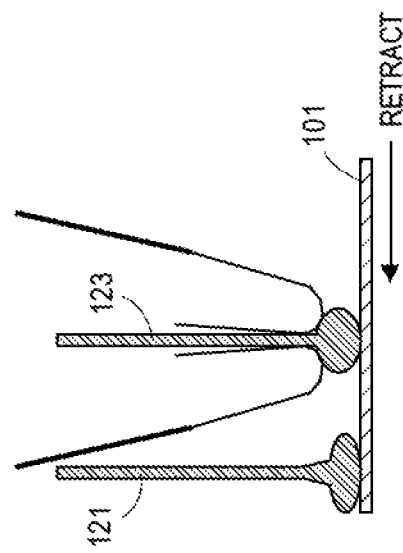
FIGS. 1B-1D illustrate an approach to landing wires on bondfingers using a substrate expansion and retraction process according to an embodiment.
Figure 1C:
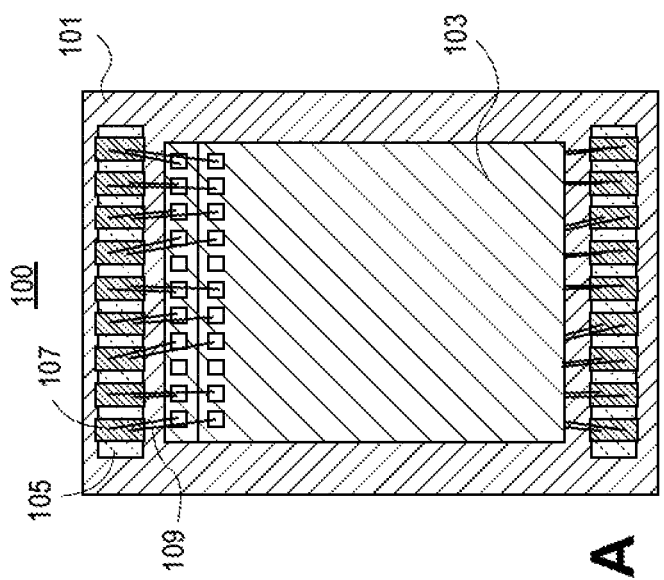
Figure 1D:
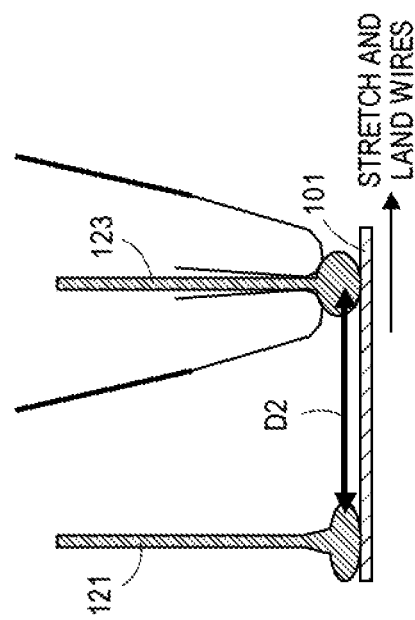

FIGS. 1B-1D illustrate an approach to wire landing using a substrate expansion and retraction process according to an embodiment. Referring to FIG. 1B, the capillary 120 contacts a first wire 121 that is located adjacent to the place where a second wire 123 is desired to be attached. The contact occurs because the size of the capillary is too large to attach the second wire 123 in the location that provides a desired distance D1 between the first wire 121 and the second wire 123 without contacting the adjacent first wire 121. In an embodiment, as shown in FIG. 1C, the substrate can be temporarily stretched such that a distance D2 is formed between the location of the first wire 121 and the location of the second wire 123, that provides additional space that allows the second wire 123 to be readily landed on a bondfinger (e.g., 107 in FIG. 1A). Subsequently, as shown in FIG. 1D, the substrate 101 can be retracted to a more compact form such that the desired distance D1 between the adjacent wires is attained. In this manner the structure is readied for subsequent process operations and for inclusion in the finished product. Consequently, in an embodiment, the number of die that can be stacked in a package of a particular size is not limited due to a need to reduce bondfinger size and number to adhere to design rule constraints.

Figure 2A:
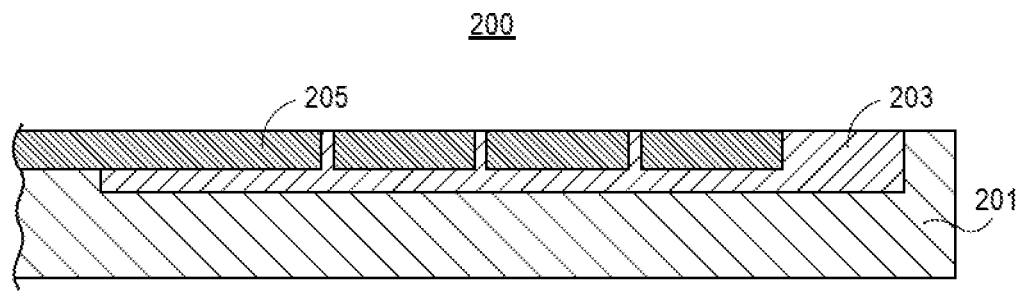
FIG. 2A is an illustration of a cross-section of a bondfinger region of a package structure according to an embodiment.

FIG. 2A is an illustration of a cross-section of a portion of a package structure 200 according to an embodiment. FIG. 2A shows substrate 201, elastomer 203 and bondfinger 205.

Referring to FIG. 2A, the substrate 201 extends underneath the elastomer 203 and covers the side of the elastomer 203. The elastomer 203 is formed above the substrate 201. The bondfingers 205 are formed above the elastomer 203. One or more side portions of the bondfingers 205 are covered by the elastomer 203. In an embodiment, the bondfingers 205 are designed to be expandable and enable the expanding of the bondfingers 205 prior to wirebonding. In this manner more area for landing bond wires is created. Thereafter, in an embodiment, the bondfinger 205 can be retracted to facilitate subsequent process operations and to form a part of the completed product.

In an embodiment, the substrate 201 can be formed from silicon. In other embodiments, the substrate 201 can be formed from other materials. In an embodiment, the elastomer 203 can be formed from a material such as rubber. In other embodiments, the elastomer can be formed from other materials. In an embodiment, the bondfingers 205 can be formed from copper. In other embodiments, the bondfingers 205 can be formed from other materials.

Figure 2B:
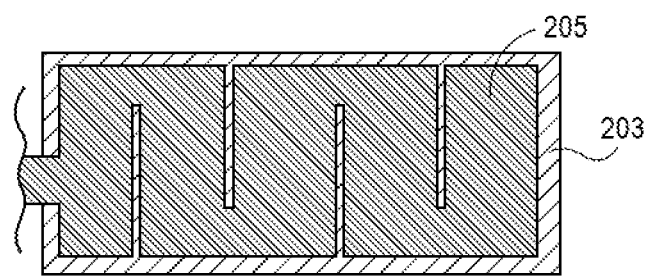
FIG. 2B shows a top view of the bondfinger region of a portion of a package structure according to an embodiment.

FIG. 2B shows a top view of the package structure 200 according to an embodiment. In an embodiment, the bondfingers 205 are formed to have a serpentine pattern characterized by adjacent rectangular parts with rectangular parts between the end rectangular parts being coupled at the top on a first side and the bottom on a second side. In other embodiment, the adjacent parts can have shapes other than a rectangular shape.

Figure 3A:
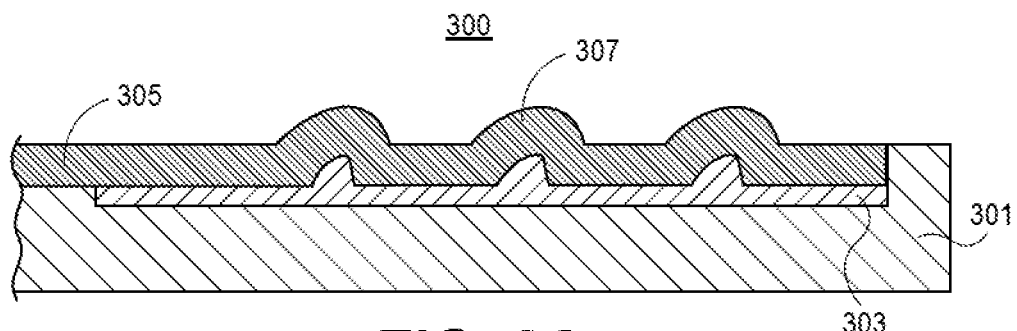
FIG. 3A is an illustration of a cross-section of a bondfinger region of a package structured according to an embodiment.

FIG. 3A is an illustration of a cross-section of a portion of a package structure 300 according to an embodiment. FIG. 3A shows substrate 301, elastomer 303 and bondfingers 305.

Referring to FIG. 3A, the substrate 301 extends underneath the elastomer 303 and covers the sides of the elastomer 303. The elastomer 303 is formed in the substrate 301. The bondfingers 305 are formed on the elastomer 303. A side portion of the bondfingers 305 are covered by the substrate 301. In an embodiment, the bondfingers 305 are configured to be expandable. This enables the expanding of the bondfingers 305 prior to wirebonding for purposes of providing sufficient space for the landing of bond wires. In an embodiment, the bondfingers 305 are formed from material that is pre-wrinkled. In an embodiment, the wrinkles provide stress relief in the Z direction. In an embodiment, the wrinkles can be a part of a corrugated metal sheet. This material can be expanded to assume a less wrinkled or flattened form and to accommodate wirebonding. In an embodiment, after wirebonding, the bondfingers 305 can then be retracted to facilitate subsequent operations and for inclusion in the finished product.

In an embodiment, the substrate 301 can be formed from silicon. In other embodiments, the substrate 301 can be formed from other materials. In an embodiment, the elastomer 303 can be formed from a rubber elastomer. In other embodiments, the elastomer can be formed from other materials. In an embodiment, the bondfingers 305 can be formed from copper. In other embodiments, the bondfingers 305 can be formed from other materials.

Figure 3B:
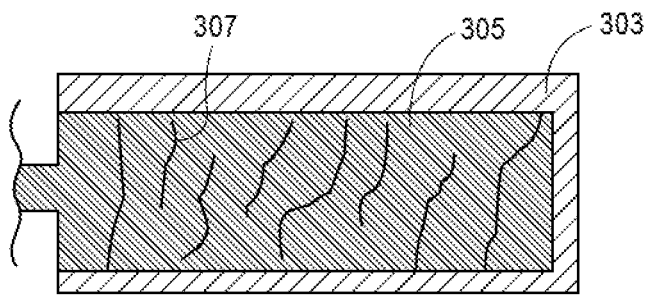
FIG. 3B shows a top view of the bondfinger region of a package structure according to an embodiment.

FIG. 3B shows a top view of the package structure 300 according to an embodiment. In an embodiment, the bondfingers 305 can be formed in pre-wrinkled foil 307. In other embodiments, the bondfingers 305 can be formed from other material. In an embodiment, the pre-wrinkled foil can be expanded and retracted.

FIGS. 4A-4D show operations in a process for forming a shrinkable package structure according to an embodiment. In an embodiment, shrinkable semiconductor package 400 includes substrate 401, elastomer 403 and bondfingers 405.

Figure 4A:
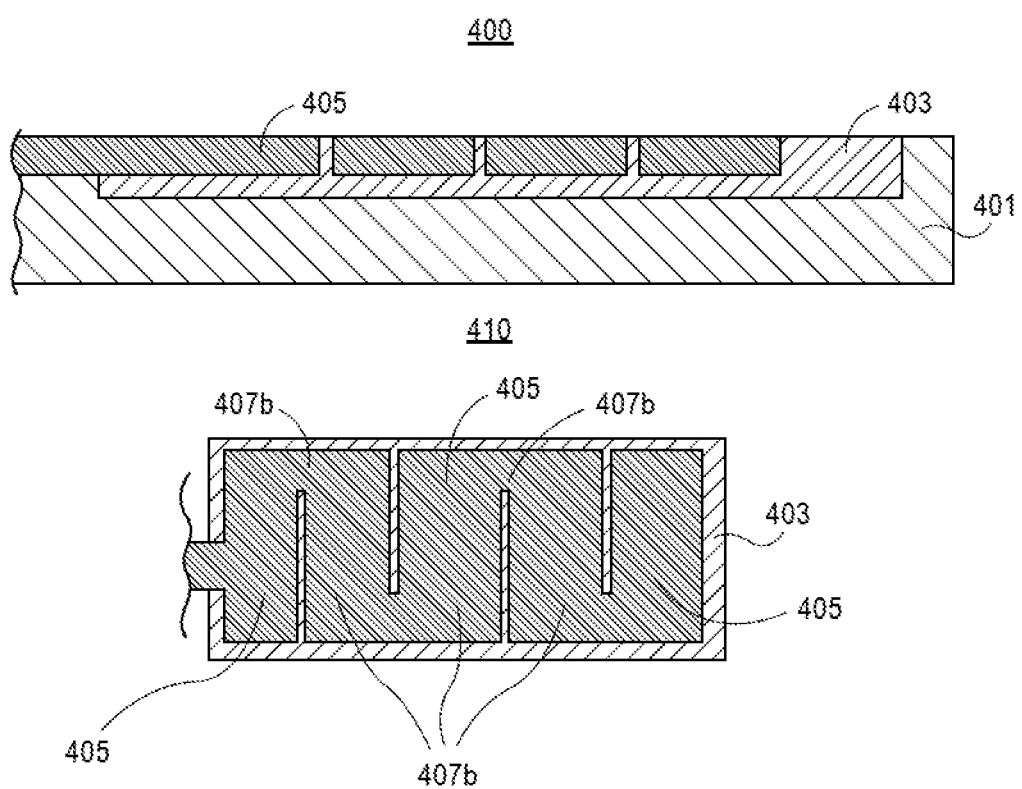
FIGS. 4A-4D show operations in a process for forming a shrinkable semiconductor package structure according to an embodiment.

FIG. 4A shows a cross-sectional view 400 (top) of the shrinkable package structure and a top-view 410 (bottom) of the shrinkable package structure according to an embodiment. Referring to FIG. 4A, the shrinkable package structure is designed to have expandable bondfingers 405. In an embodiment, a serpentine like metal pattern is used to provide the bondfingers 405 with expandability. In an embodiment, the serpentine like metal pattern is formed on the elastomer 403. In another embodiment, a bondfinger region that is pre-wrinkled is formed on the elastomer 403 (see FIGS. 3A and 3B). In such embodiments, the bondfingers can be formed from pre-wrinkled copper metal foil that can be used everywhere in the design. In an embodiment, the area of the semiconductor package where the pre-wrinkled copper metal foil is made expandable is the area that is located directly over the elastomer. In FIG. 4A, the top view of the shrinkable package substrate 400 shows the pattern of the metal trace that forms the serpentine bondfingers 405. As shown in FIG. 4A, the serpentine bondfingers 405 are characterized by adjacent and vertically oriented rectangular parts 407a that are alternately coupled at top and bottom by horizontal parts 407b. In an embodiment, the serpentine bondfingers 405 are surrounded by narrow regions of elastomeric material of the elastomer 403. This material is exposed around the traces of the serpentine bondfinger 405. In an embodiment, the elastomer portion of the substrate can be placed into a cavity of the substrate that is formed by cutting out a portion of the substrate core.

Figure 4B:
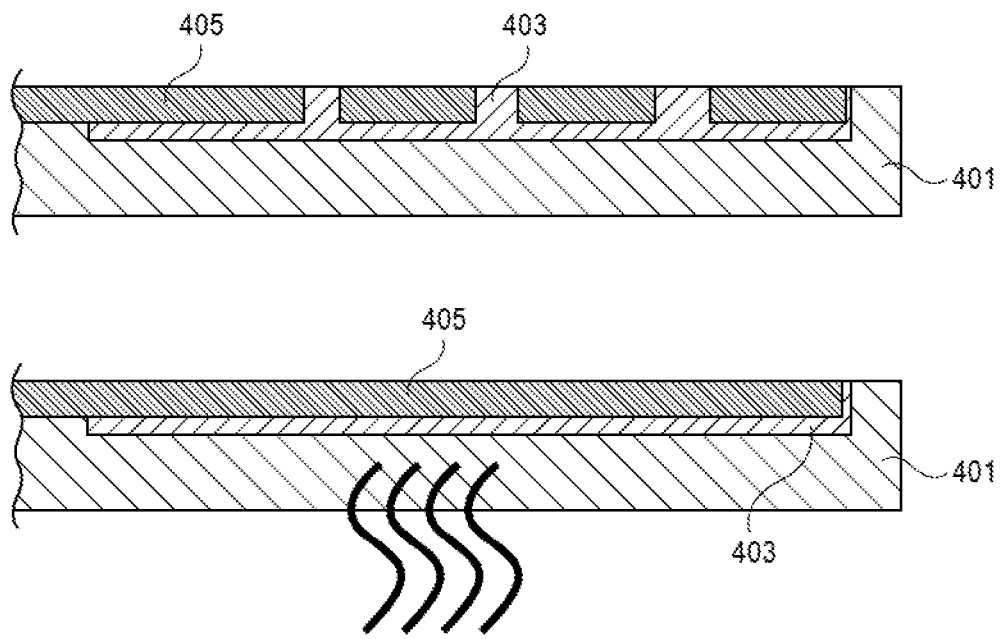

Referring to FIG. 4B, subsequent to one or more operations that result in the cross-sections shown in FIG. 4A, the substrate is mechanically stretched prior to the formation of wirebonds. In an embodiment, substrates can be heated to induce pliability and assist in the stretching process. In an embodiment, the substrate can be held in the stretched position by a carrier frame that includes pins that hold the substrate in place. In other embodiments, the substrate can be held in the stretched position by using a carrier frame with tape. In still other embodiments, the substrate can be held in place in other suitable manners. In FIG. 4B, the top structure provides a cross-sectional view of a portion of a package structure that has a serpentine bondfinger structure. In FIG. 4B, the bottom structure provides a cross-sectional view of a portion of a package substrate that has a pre-wrinkled bondfinger structure. In an embodiment, a semiconductor die can be attached to the substrate before the substrate is stretched.

Figure 4C:
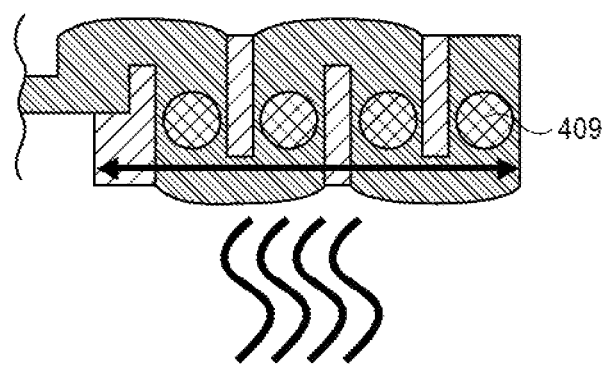

Referring to FIG. 4C, subsequent to one or more operations that result in the cross-section shown in FIG. 4B, the bondfingers are wirebonded to the die. In an embodiment, the bondfingers are wirebonded to the die using wirebonds 409. In an embodiment, the wires can be attached using ball or crescent bonds. In other embodiments, other types of bonds can be used.

Figure 4D:
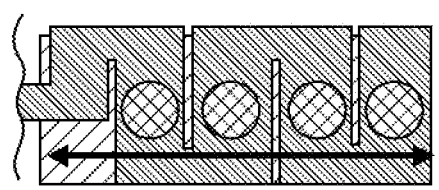

Referring to FIG. 4D, subsequent to one or more operations that result in the cross-section shown in FIG. 4C, the substrate is retracted. See FIG. 4D where the spaces between the bondfingers are shown to have narrowed as compared to FIG. 4C. In an embodiment, upon the release and the cooling of the substrate to room temperature the elastomer retracts and brings the ball bonds closer together. In an embodiment, based on the stretching/retracting operations, the ball bonds can be brought more closely together than they could be brought without the stretching/retraction operations, due to the wirebond capillary tip outer diameter.

In an embodiment, other areas of the substrate can include expandable sections such as the space between the die edge and the bondfinger edges. In an embodiment, conductive traces and planes that need to temporarily expand can be designed with a stress relief feature like the serpentine traces that are described herein.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 5:
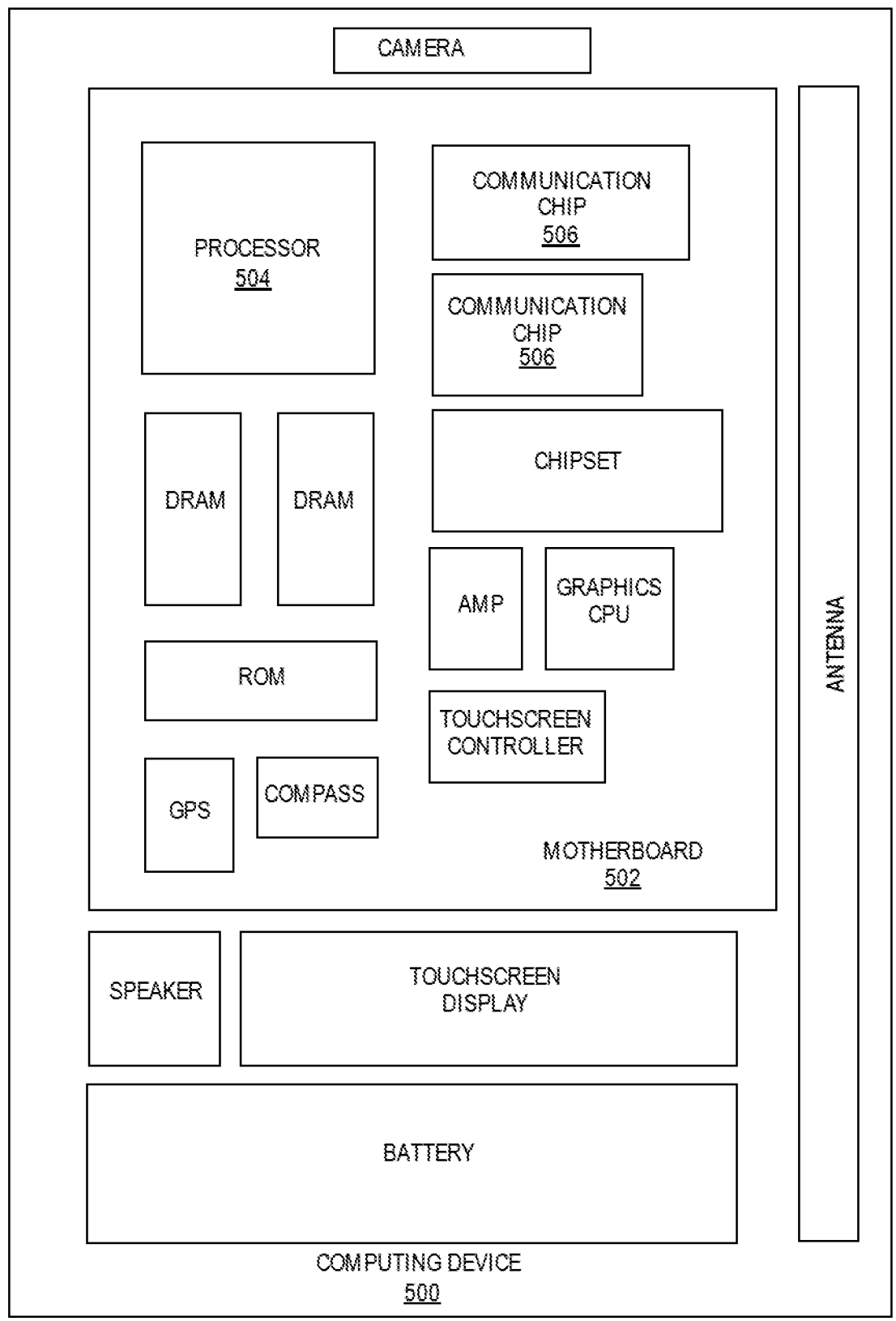
FIG. 5 illustrates a computing device in accordance with one implementation of the invention.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
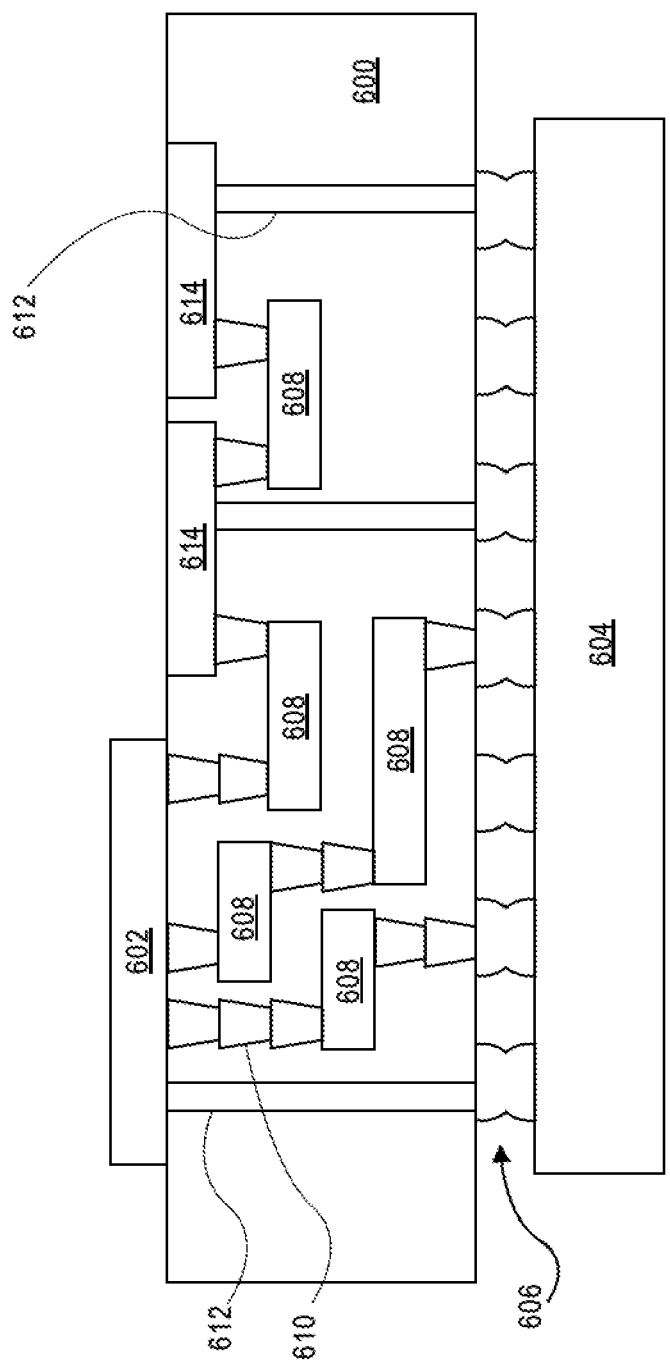
FIG. 6 illustrates an interposer that includes one or more embodiments of the invention.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: A semiconductor structure, comprising: a substrate; an elastomer coupled to the substrate; and a plurality of bondfingers formed on the elastomer, the substrate, the elastomer and the bondfingers configured to cooperatively expand and retract.

Example embodiment 2: The semiconductor structure of example embodiment 1, wherein the bondfingers include pre-wrinkled foil.

Example embodiment 3: The semiconductor structure of example embodiment 1, wherein the bondfingers include a serpentine pattern of interconnected parts.

Example embodiment 4: The semiconductor structure of example embodiment 1, wherein the bondfingers are configured to be expanded before wirebonding.

Example embodiment 5: The semiconductor structure of example embodiment 1, wherein the bondfingers are configured to be retracted after wirebonding.

Example embodiment 6: The semiconductor structure of example embodiment 1, wherein the substrate is configured to be expanded in response to an application of heat.

Example embodiment 7: The semiconductor structure of example embodiment 2, 3, 4, 5 and 6, wherein the substrate is configured to have an expansion of the substrate maintained by a carrier frame and pins or tape.

Example embodiment 8: A semiconductor package includes a substrate, a die coupled to a substrate, an elastomer coupled to the substrate, and a plurality of bondfingers on the elastomer, where the elastomer, the substrate, the elastomer and the bondfingers are configured to cooperatively expand and retract. The semiconductor package also includes a plurality of wire bonds coupled to the bondfingers and to the die.

Example embodiment 9: The semiconductor package of example embodiment 8, wherein the bondfingers include pre-wrinkled foil.

Example embodiment 10: The semiconductor package of example embodiment 8, wherein the bondfingers include a serpentine pattern of interconnected parts.

Example embodiment 11: The semiconductor package of example embodiment 8, wherein the bondfingers are configured to be expanded before wirebonding.

Example embodiment 12: The semiconductor package of example embodiment 8, wherein the bondfingers are configured to be retracted after wirebonding.

Example embodiment 13: The semiconductor package of example embodiment 8, wherein the substrate is configured to be expanded in response to an application of heat.

Example embodiment 14: The semiconductor package of Example embodiment 8, 9, 10, 11, 12 and 13 wherein the substrate is configured to have an expansion of the substrate maintained by a carrier frame and pins or tape.

Example embodiment 15: A method includes forming a substrate, forming an elastomer on the substrate, and forming bondfingers on the elastomer. The substrate, the elastomer and the bondfingers are configured to cooperatively expand and retract.

Example embodiment 16: The method of example embodiment 15, wherein the bondfingers include pre-wrinkled foil.

Example embodiment 17: The method of example embodiment 15, wherein the bondfingers include a serpentine pattern of interconnected parts.

Example embodiment 18: The method of example embodiment 15, wherein the bondfingers are configured to be expanded before wirebonding.

Example embodiment 19: The method of example embodiment 15, wherein the bondfingers are configured to be retracted after wirebonding.

Example embodiment 20: The method of example embodiment 15, 16, 17, 18 and 19 wherein the substrate is configured to be expanded in response to an application of heat.

What is claimed is:

1. A semiconductor structure, comprising:
   a substrate;
   an elastomer coupled to the substrate; and
   a plurality of bondfingers formed on the elastomer, the substrate, the elastomer and the bondfingers configured to cooperatively expand and retract, wherein the bondfingers include pre-wrinkled foil, the pre-wrinkled foil having a plurality of wrinkles, individual ones of the plurality of wrinkles having a protrusion between first and second non-protruding portions, the protruding portion having a height greater than a height of both the first and second non-protruding portions.

2. The semiconductor structure of claim 1, wherein the bondfingers include a serpentine pattern of interconnected parts.

3. The semiconductor structure of claim 1, wherein the bondfingers are configured to be expanded before wirebonding.

4. The semiconductor structure of claim 1, wherein the bondfingers are configured to be retracted after wirebonding.

5. The semiconductor structure of claim 1, wherein the substrate is configured to be expanded in response to an application of heat to the semiconductor structure.

6. The semiconductor structure of claim 1, wherein the substrate is configured to have an expansion of the substrate.

7. A semiconductor package, comprising:
a substrate;
a die coupled to a substrate;
an elastomer coupled to the substrate;
a plurality of bondfingers formed on the elastomer, the substrate, the elastomer and the bondfingers configured to cooperatively expand and retract, wherein the bondfingers include pre-wrinkled foil, the pre-wrinkled foil having a plurality of wrinkles, individual ones of the plurality of wrinkles having a protrusion between first and second non-protruding portions, the protruding portion having a height greater than a height of both the first and second non-protruding portions; and
a plurality of wire bonds coupled to the bondfingers and to the die.

8. The semiconductor package of claim 7, wherein the bondfingers include a serpentine pattern of interconnected parts.

9. The semiconductor package of claim 7, wherein the bondfingers are configured to be expanded before wirebonding.

10. The semiconductor package of claim 7, wherein the bondfingers are configured to be retracted after wirebonding.

11. The semiconductor package of claim 7, wherein the substrate is configured to be expanded in response to an application of heat to the semiconductor package.

12. The semiconductor package of claim 7, wherein the substrate is configured to have an expansion of the substrate.

13. A method, comprising:
forming a substrate;
forming an elastomer on the substrate; and
forming bondfingers on the elastomer, wherein the substrate, the elastomer and the bondfingers are configured to cooperatively expand and retract, wherein the bondfingers include pre-wrinkled foil, the pre-wrinkled foil having a plurality of wrinkles, individual ones of the plurality of wrinkles having a protrusion between first and second non-protruding portions, the protruding portion having a height greater than a height of both the first and second non-protruding portions.

14. The method of claim 13, wherein the bondfingers include a serpentine pattern of interconnected parts.

15. The method of claim 13, wherein the bondfingers are configured to be expanded before wirebonding.

16. The method of claim 13, wherein the bondfingers are configured to be retracted after wirebonding.

17. The method of claim 13, wherein the substrate is configured to be expanded in response to an application of heat to the substrate.

* * * * *